(12) United States Patent
Cao

(10) Patent No.: US 6,486,696 B1
(45) Date of Patent: Nov. 26, 2002

(54) TERMINATION STRUCTURE FOR HIGH SPEED, HIGH PIN DENSITY CHIPS

(75) Inventor: Xianguo Cao, Shanghai (CN)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/511,150

(22) Filed: Feb. 23, 2000

(51) Int. Cl.[7] .............................................. H03K 17/16
(52) U.S. Cl. ........................... 326/30; 326/86; 326/90; 326/21; 333/22 R; 333/12; 333/32
(58) Field of Search ......................... 326/21, 30, 86, 326/90; 333/12, 32, 22 R; 327/379

(56) References Cited

U.S. PATENT DOCUMENTS

| | | | | |
|---|---|---|---|---|
| 5,111,080 A | * | 5/1992 | Mizukami et al. | 307/475 |
| 5,227,677 A | * | 7/1993 | Furman | 326/30 |
| 5,495,186 A | * | 2/1996 | Kanazawa et al. | 326/83 |
| 5,519,353 A | | 5/1996 | Rainal | |
| 5,604,450 A | * | 2/1997 | Borkar et al. | 326/82 |
| 5,666,302 A | * | 9/1997 | Tanaka et al. | 708/819 |
| 5,686,872 A | * | 11/1997 | Fried et al. | 333/22 R |
| 5,872,471 A | * | 2/1999 | Ishibashi et al. | 327/98 |
| 6,046,653 A | * | 4/2000 | Yamada | 333/32 |
| 6,114,898 A | * | 9/2000 | Okayasu | 327/437 |

\* cited by examiner

Primary Examiner—Michael Tokar
Assistant Examiner—Vibol Tan
(74) Attorney, Agent, or Firm—Harness, Dickey, & Pierce, P.L.C.

(57) ABSTRACT

An apparatus including first and second devices, at least one connection between an input of the second device and an output of the first device, and at least one resistor in series between the connection and the input of the second device. The series resistor, acting as a type of end termination, positively alters the waveforms of the signals input to the second device. In particular, glitches and ringing after the input pin package or at the input of the second device (at the gate for a CMOS transistor) are reduced. Overshoots and undershoots are also reduced. As a result, the input signals are usable and the interface between the first and second devices operates correctly. Further, the setup procedure of the valid logic level of the input signal can be accomplished much more quickly and is much more stable. The series resistor also consumes very little extra power.

25 Claims, 11 Drawing Sheets

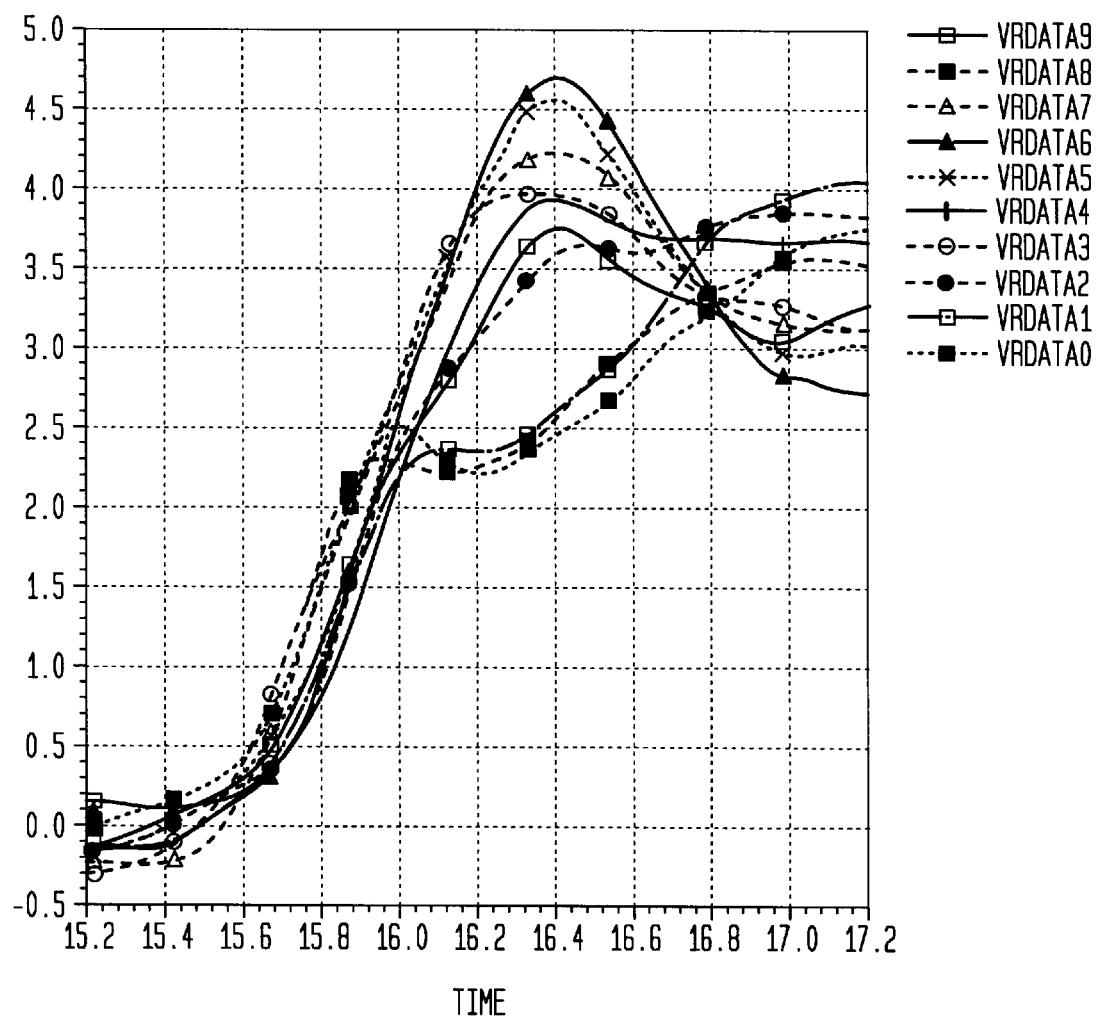

TERMINATION STRUCTURE FOR HIGH SPEED, HIGH PIN DENSITY CHIPS

BACKGROUND OF THE INVENTION

1. Field of the Invention

The present invention relates generally to high speed, high pin density chips, and more particularly, to a termination structure for a high speed, high pin density chips which reduces the effects of signal ringing, unwanted oscillations, overshoots and undershoots, while consuming little extra power.

2. Description of the Related Art

In a high speed and high pin density package device (HSHD) which has on the order of several hundred pins, the parasitic parameters of the HSHD package device, such as the parasitic capacitance, inductance, mutual inductance and resistance become prominent and result in large cross talk and oscillation of the input signals. This cross talk and oscillation lower the performance of the HSHD device.

For example, consider the example in FIG. 1 of a high speed and high density package device (HSHD) 10 driving another HSHD 20 device through a PCB trace ($T_1$–$T_N$) 30. When the output signals 12 from the corresponding pins $Pin_1$–$Pin_N$ of the source HSHD 10 pass through the source high density package 40, the output signals 14 become somewhat irregular. Then the output signals 14 pass through the PCB trace ($T_1$–$T_N$) 30 through the destination high density package 50 to the input pins $Pin_1$–$Pin_N$ of the destination HSHD device 20. Due to the parasitic effects caused in the process of passing through the input pins' package $R_1$–$R_N$, the signals 16 exhibit oscillation, large glitches on the rising edge of the signals, and large overshoots and undershoots. The glitches, overshoots and undershoots greatly increase the setup process time of the input signal's valid logic level; in fact a large amplitude overshoot and/or undershoot may prevent the valid logic level from being set up during an entire clock cycle. Large overshoots may also damage the input CMOS logic.

The arrangement in FIG. 1 may also introduce signal ringing. Ringing results from signal reflection in the PCB trace ($T_1$–$T_N$) 30. There have been numerous attempts to reduce or eliminate signal ringing by address termination when the output signal of a device travels through a PCB trace to the input of another device. Source terminations (resistors) and end terminations (resistors and capacitors) have been used to attempt to solve the signal ringing problem. FIG. 1 is an example of a source termination structure. In FIG. 1, resistors $R_{E1}$, ..., $R_{EN}$ 18 act as the source termination of the interface between HSHD 10 and HSHD 20.

FIG. 2 is an example of an end termination structure. In FIG. 2, resistors $Rt_1$ ... $Rt_N$ act as the end termination of the interface between HSHD 10 and HSHD 20. FIGS. 3a–3c illustrate several end termination structures. FIG. 3a illustrates the structure in FIG. 2, while FIG. 3b illustrates a dual resistor ($Rt_M$ and $Rt_N$) configuration (similar to the configuration used in U.S. Pat. No. 5,519,353 to Rainal). FIG. 3c illustrates an alternative resistor $Rt_N$ and capacitor $C_N$ configuration. In FIGS. 1 and 2, the packages 40 and 50 are shown as being connected with a vertical line, in order to illustrate that the packages 40 and 50 are related to each other by mutual inductance.

As set forth above, the termination structures in FIGS. 3a–3c are used to solve signal ringing in PCB traces, such as PCB trace ($T_1$–$T_N$) 30. However, other problems which result from the configuration of FIG. 1, include unwanted oscillations, glitches, undershoots and overshoots. These problems may be caused by the package 50 of the HSHD input device 20 itself. The termination structures in FIGS. 3a–3c reduce, to some degree, the signal oscillations, glitches, undershoots and overshoots. However, the structures shown in FIG. 3b and 3c consume extra power, and the values of the resistor $Rt_N$ and capacitor $C_N$ in the structure of FIG. 3c are difficult to choose when large parasitic effects exist in the package 50 of the HSHD input device 20.

For example, in FIG. 3c, if a signal of a certain frequency propagates from left (input) of the PCB trace Tn to right (output), a multiplying factor relative to the signal frequency, namely $(1+j\omega RC)/(1+j\omega)(Ro+R)C)$, where Ro is the impedance of the PCB trace Tn, R is the resistance of Rtn, C is the capacitance of Cn and $\omega$ is the frequency of the signal may be added to the output signal. This results in the introduction of a pole and a zero evident in a Pole-Zero Plot, which may cause the output signal to oscillate. Another problem introduced by the arrangement in FIG. 3c is that the multiplying factor is usually smaller than 1, which reduces the valid input logic voltage level. This condition is worsened if $R \leq Ro$. FIG. 3a and FIG. 3b also introduce this valid logic voltage level problem.

The signal oscillations, glitches, undershoots and overshoots problems caused by the package 50 of the HSHD input device 20 in FIG. 1 are illustrated in FIGS. 4a–4d. FIGS. 4a–4d illustrate the input signals 16 at $Pin_M$ with the circuitry illustrated in FIG. 1. In particular, FIG. 4a illustrates the fastest operation condition of the HSHD input device 10, where the input signals 16 are propagated at the fastest speed and the largest oscillation or overshoot and undershoot may occur. This is termed the "worst case fast" condition. As illustrated between time 16 and 18 in FIG. 4a, large oscillations are apparent. FIG. 4c illustrates the leading edge of the waveform, including the large oscillations, of FIG. 4a in more detail.

FIG. 4b illustrates a counterpart waveform for the waveform illustrated in FIG. 4a. In particular, FIG. 4b illustrates the slowest operation condition or "worst case slow" condition of the HSHD input device 10, where the input signal 16s are propagated at the slowest speed, and the smallest oscillation, overshoot, or undershoot may occur. As illustrated between time 20 and 22 in FIG. 4b, large oscillations are apparent. FIG. 4d illustrates the leading edge of the waveform, including the large oscillations, in FIG. 4b in more detail.

SUMMARY OF THE INVENTION

The present invention provides a novel termination structure, which reduces the problems described above with conventional PCB traces between HSHD devices and their packages.

In particular, in one embodiment of the present invention, a resistor is inserted in series between a PCB trace and an input pin of the destination high density package. The series resistor, acting as a type of end termination, positively alters the waveforms of the signals input to the destination high speed density package. In particular, glitches and ringing after the input pin package or at the output of the destination high density package (at the gate for a CMOS transistor) are reduced. Overshoots and undershoots are also reduced. As a result, the input signals are usable and the interface between HSHD devices operates correctly. Further, the setup procedure of the valid logic level of the input signal can be accomplished much more quickly and is much more stable.

An additional advantage of the present invention is that the inserted series resistor consumes very little extra power (except for a little thermal energy). The inserted series resistor may increase the rise/fall times of the input signals very slightly, but this increase is much smaller than the increase caused by the conventional glitches, overshoots and undershoots. Therefore, if a signal is one of the input signals to which an inserted series resistor is added, the value selected for the inserted resistor for the input signal may depend on both overshoot and undershoot tolerances of the device and on the rise/fall time requirement of the signals.

BRIEF DESCRIPTION OF THE DRAWINGS

FIGS. 4a–4d are waveforms illustrating the "worst case fast" and "worst case slow" conditions in the conventional HSHD device with a conventional end termination structure.

DETAILED DESCRIPTION OF THE PREFERRED EMBODIMENTS

As described above, the present invention is directed to a novel termination structure, which reduces the ringing, glitches, overshoots, and undershoots in an arrangement of HSHD devices and their packages, connected by PCB traces.

In one embodiment of the present invention, the novel termination structure includes a resistor inserted in series between the PCB trace and the input pin of the destination high density package. The series resistor, acting as a type of end termination, positively alters the waveforms of the output signals of the destination high density package. In particular, glitches and ringing after the input pin package or at the input transistor of the chip (at the gate for a CMOS transistor) are reduced. Overshoots and undershoots are also reduced. As a result, the input signals are usable and the interface between HSHD devices operates correctly. Further, the setup procedure of the valid logic level of the input signal can be accomplished much more quickly and is much more stable.

An additional advantage of the present invention is that the inserted series resistors consume very little extra power (except for a little thermal energy). Further, the value selected for the inserted resistor for an input signal may depend on both overshoot and undershoot tolerances of the device and on the rise time requirement of the signals. As discussed above with respect to FIG. 1, the output signals 12 of HSHD 10 pass through HSHD 10's output package 40 of $S_1, \ldots, S_N$, source termination resistors $Re_1, \ldots, Re_N$, and PCB traces 30 of $T_1, \ldots, T_N$ (PCB traces are modeled by a transmission line) to the input nodes of HSHD 20, identified $In_1, \ldots, In_N$. From $In_m$ to $Pin_m$ (m=1, ..., N) of HSHD 20, the signals must pass through the packages 50 of HSHD 20 which are shown as $r_1, \ldots, r_N$ in FIG. 1. Large glitches, overshoots and undershoots occur because of the presence of the package's parasitic circuit network including parasitic capacitance, inductance, mutual inductance and resistance.

Figure 5:
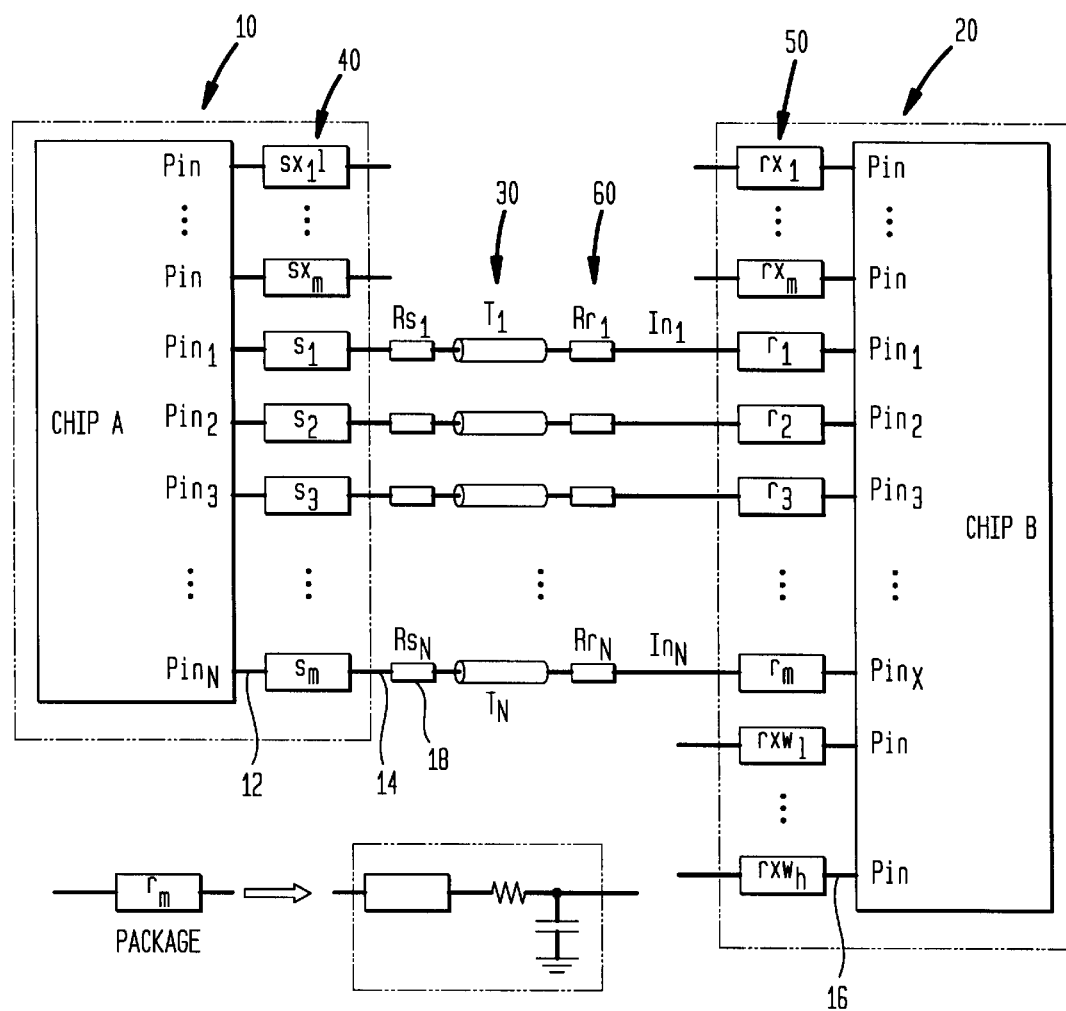
FIG. 5 illustrates a device of the present invention, in one exemplary embodiment.

As illustrated in FIG. 5, if properly valued resistors 60 $(Rr_1, \ldots, Rr_N)$ are inserted in series between transmission line $T_m$ and package 50 $r_m$ (m=1, ..., N), the glitches at $Pin_m$ (m=1, ..., N) of HSHD 20, and overshoots and undershoots are reduced. The transit curves of the input signals at $Pin_m$ also become much smoother.

Choosing the resistance value of resistors 60 depends on the package parasitic characteristics, the signal frequency, and the rise/fall time requirements of the signal, which can be readily determined through transistor-level simulation, such as a SPICE simulation, which is known to one of ordinary skill in the art.

Figure 1:
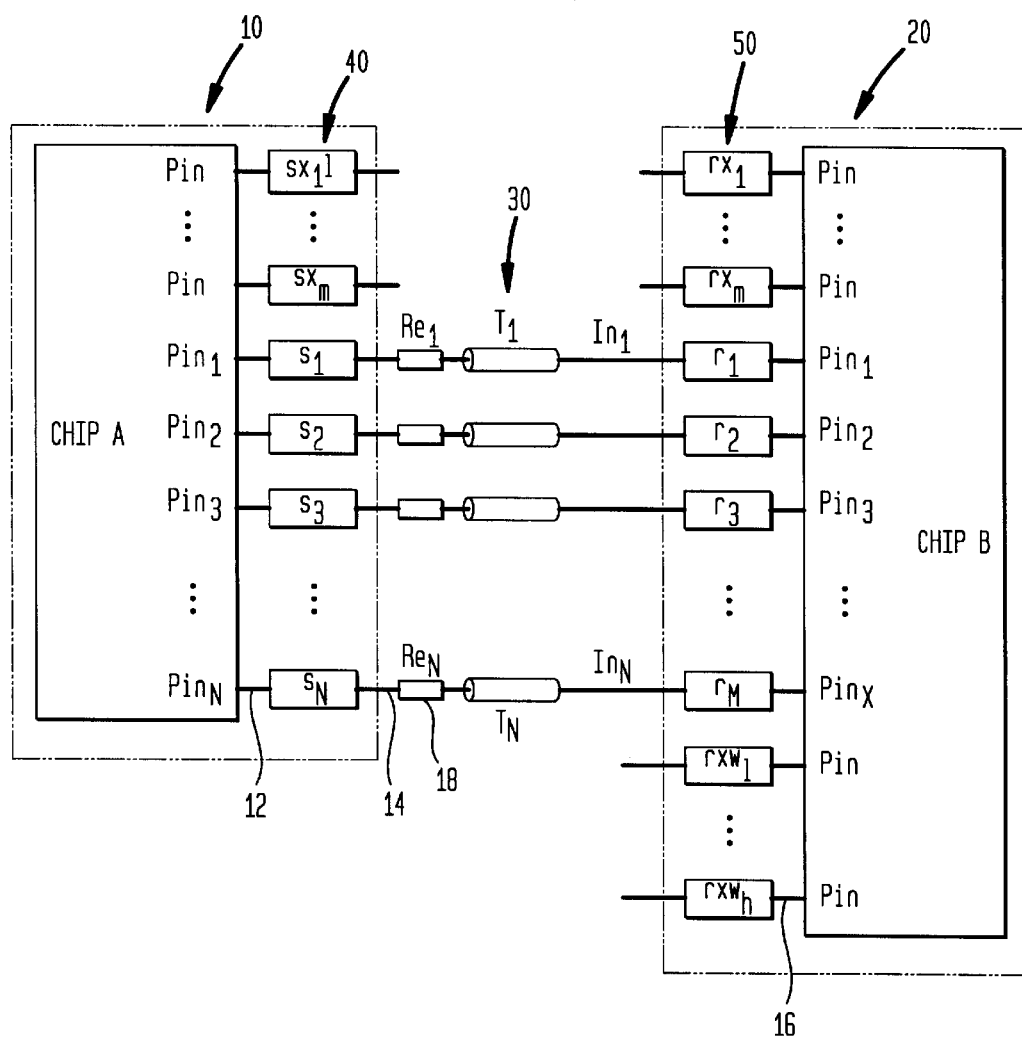
FIG. 1 illustrates the conventional high speed, high density (HSHD) package device with a conventional source termination structure.
Figure 6A:
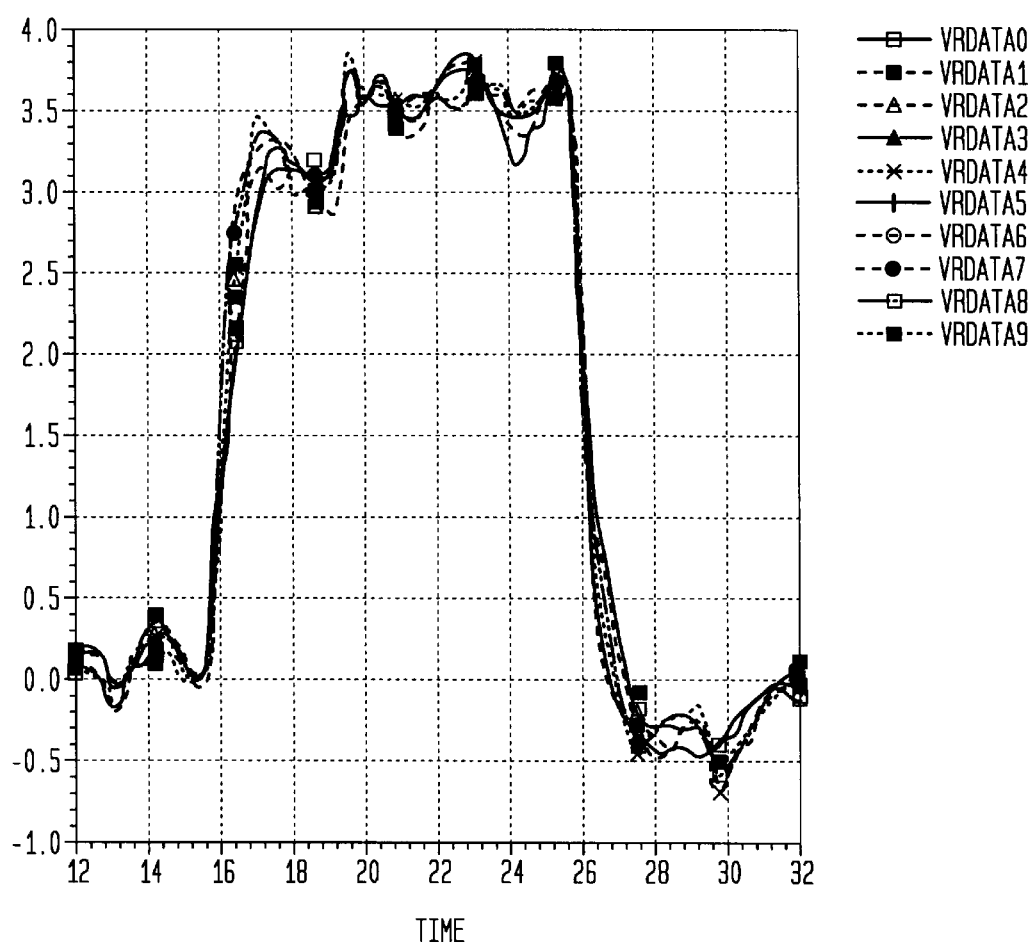
FIGS. 6a–6d are waveforms illustrating the "worst case fast" and "worst case slow" conditions in the device of FIG. 5.

FIG. 5 illustrates the circuitry with resistors 60 $(Rr_1, \ldots, Rr_N)$ inserted in series between transmission line $T_m$ package 50 $r_m$, while FIG. 1 illustrates the circuitry without inserted series resistors. Waveforms representing the input signals 16 of FIG. 5 are shown in FIGS. 6a–6d. FIGS. 4a–4d illustrate the input signals 16 at $Pin_M$ in the circuitry illustrated in FIG. 1. FIGS. 6a–6d illustrate the input signals 16 at $Pin_M$ with the circuitry illustrated in FIG. 5. In particular, FIG. 6a illustrates the fastest operation condition of the HSHD input device 10, where the input signals 16 are propagated at the fastest speed and the largest oscillation or overshoot and undershoot may occur. As illustrated between time 16 and 18 in FIG. 6a, the oscillations are much smaller than the oscillations illustrated in during the same time period in FIG. 4a. FIG. 6c illustrates the leading edge of the waveform of FIG. 6a. Comparing FIG. 6c to FIG. 4c, the oscillations in FIG. 6c are much less apparent.

Figure 6B:
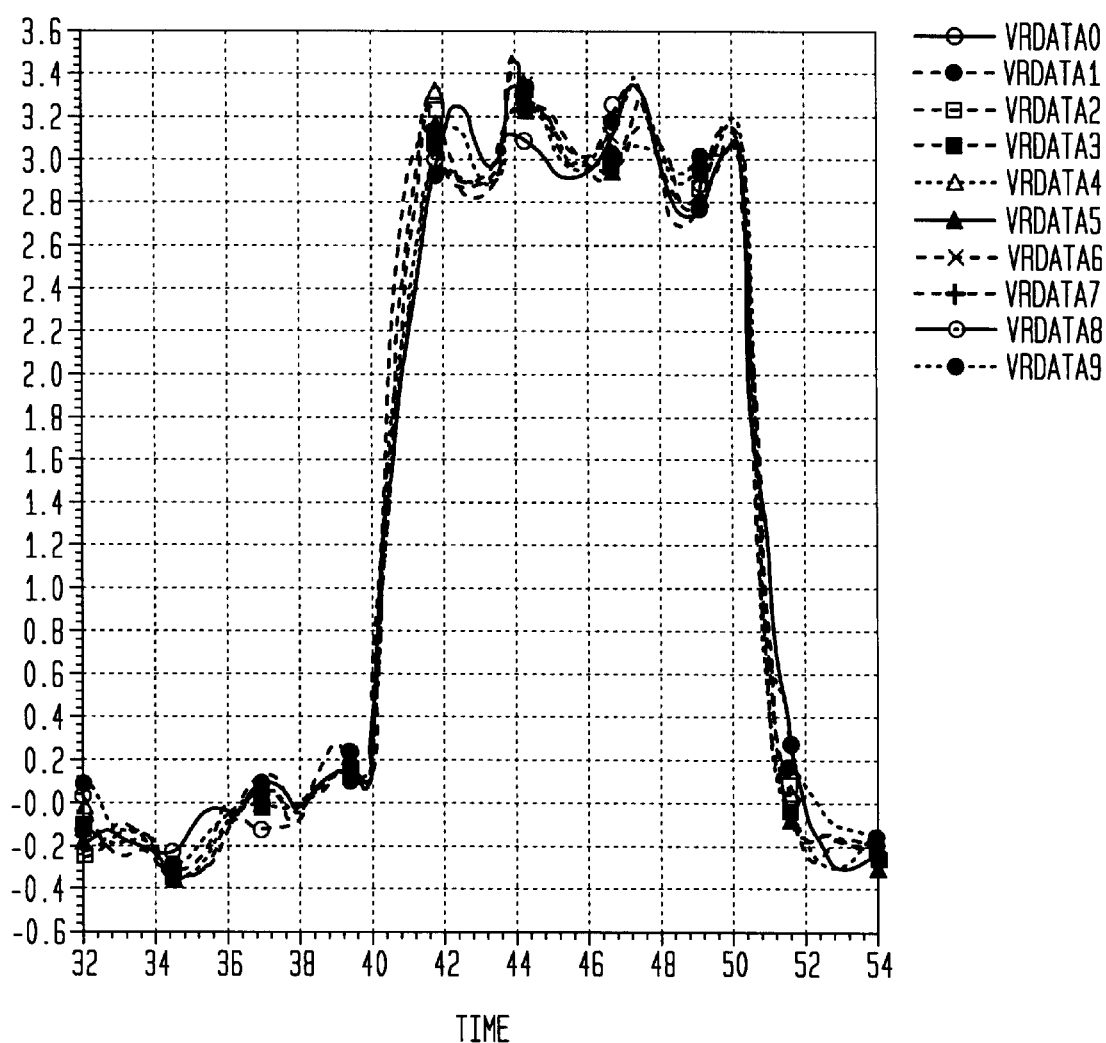
Figure 6C:
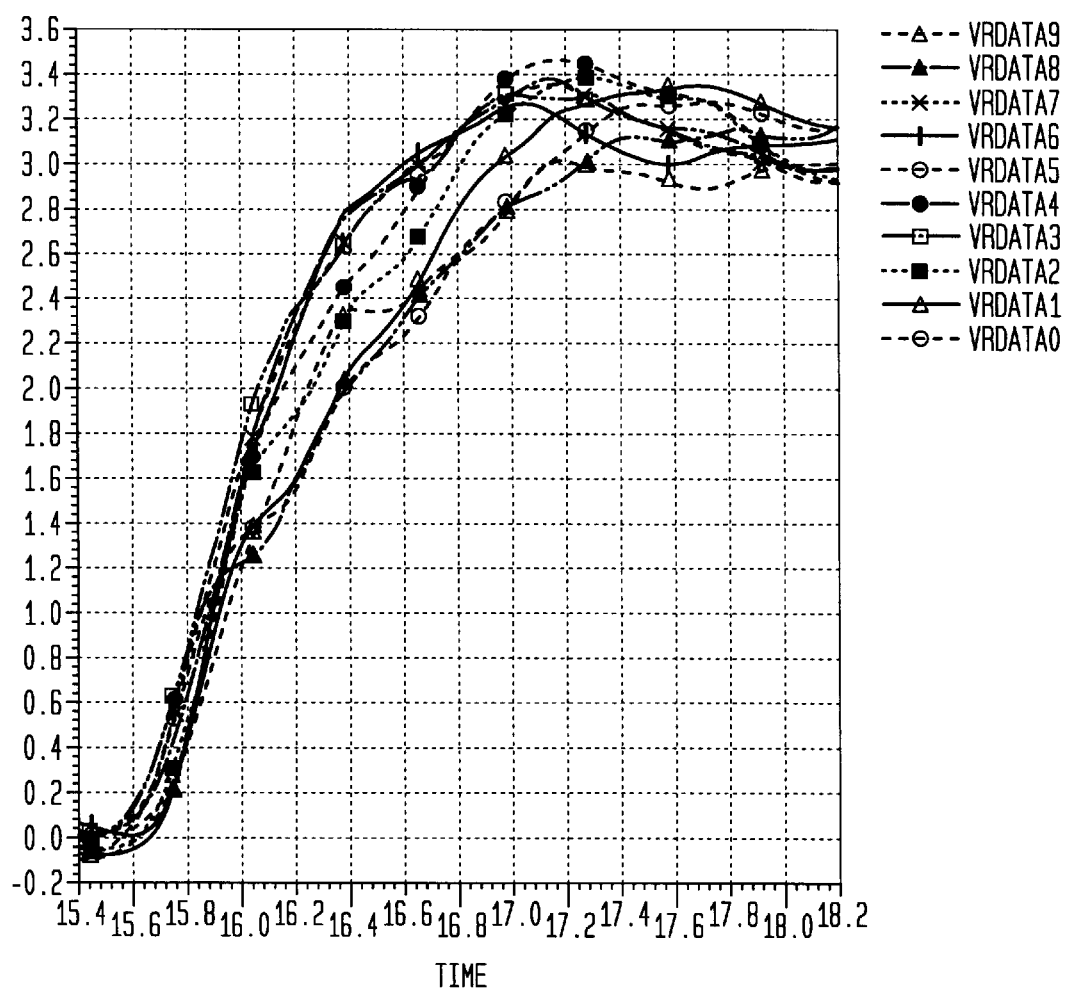
Figure 6D:
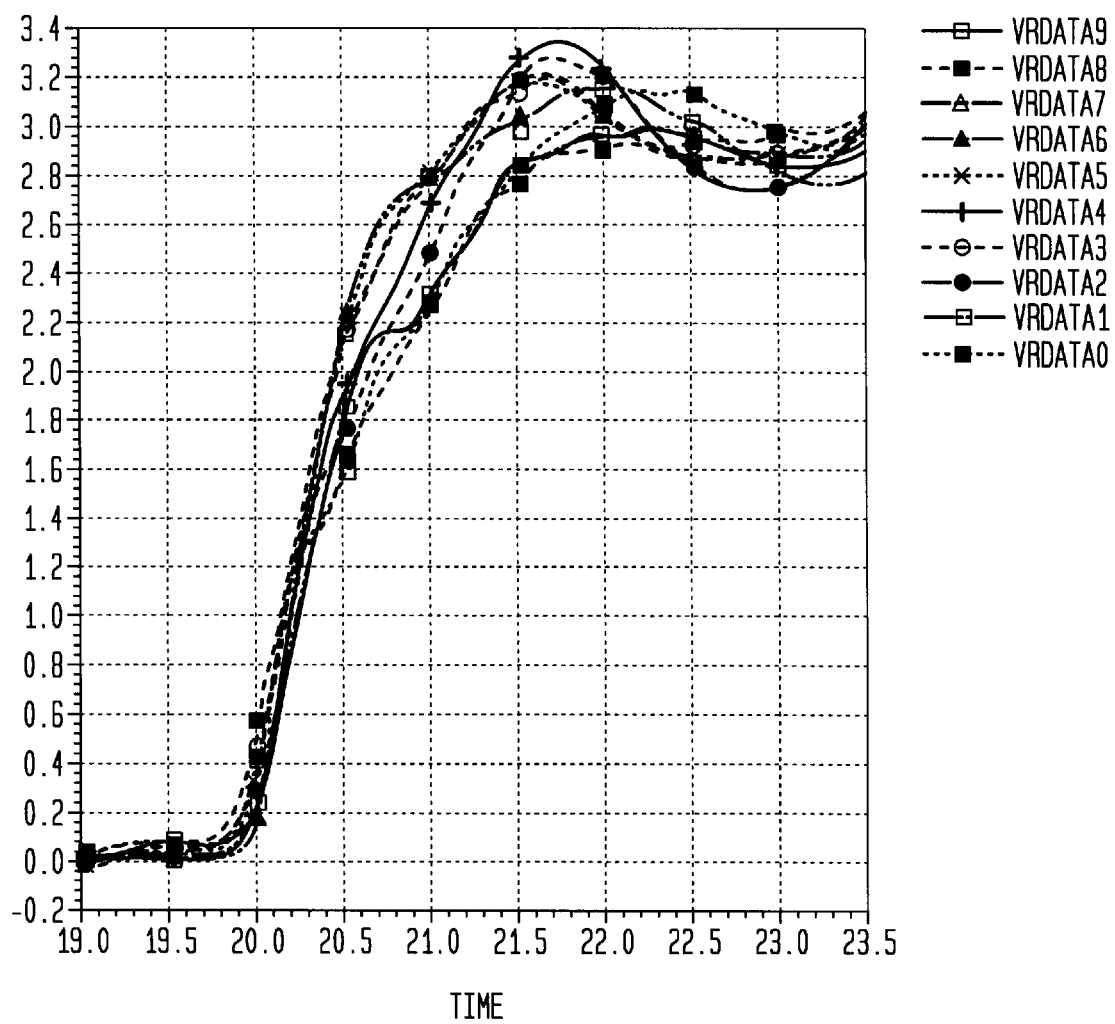

FIG. 6b illustrates the slowest operation condition or "worst case slow" condition of the device of FIG. 5, where the input signal 16s are propagated at the slowest speed, and the smallest oscillation, overshoot, or undershoot may occur. As illustrated between time 20 and 22 in FIG. 6b, the oscillations are much smaller than the oscillations illustrated in during the same time period in FIG. 4b. FIG. 6d illustrates the leading edge of the waveform of FIG. 6b. Comparing FIG. 6d to FIG. 4d, the oscillations in FIG. 6d are much less apparent.

Figure 2:
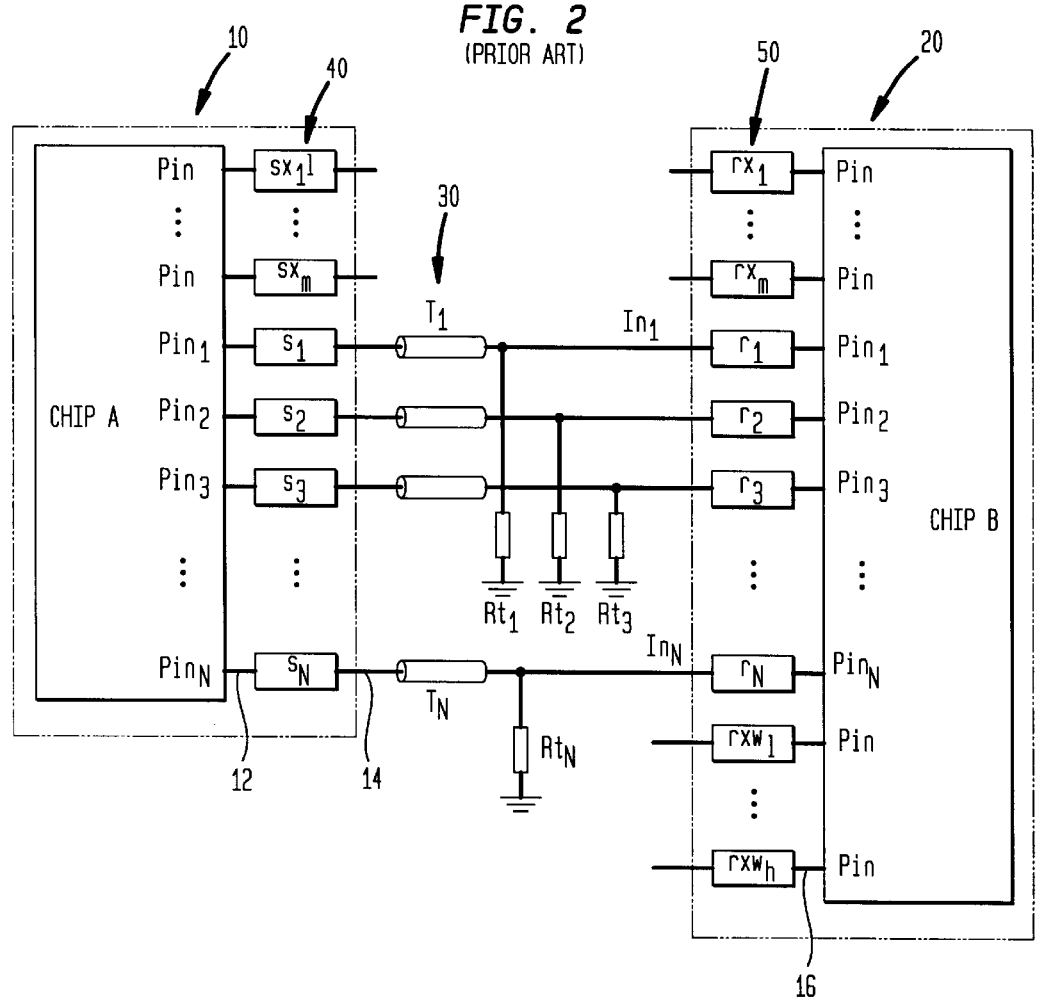
FIG. 2 illustrates the conventional HSHD device with a conventional end termination structure.
Figure 3A:
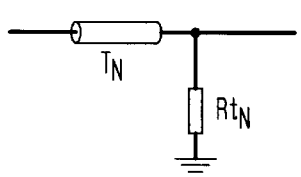
FIGS. 3a–3c illustrate alternative conventional end termination structures.
Figure 3B:
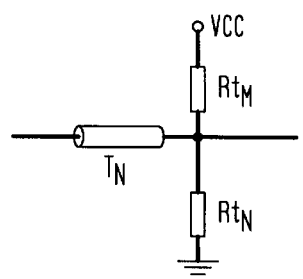
Figure 3C:
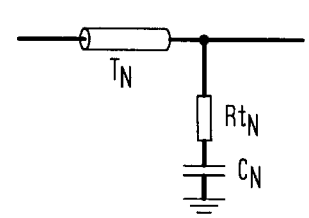
Figure 4A:
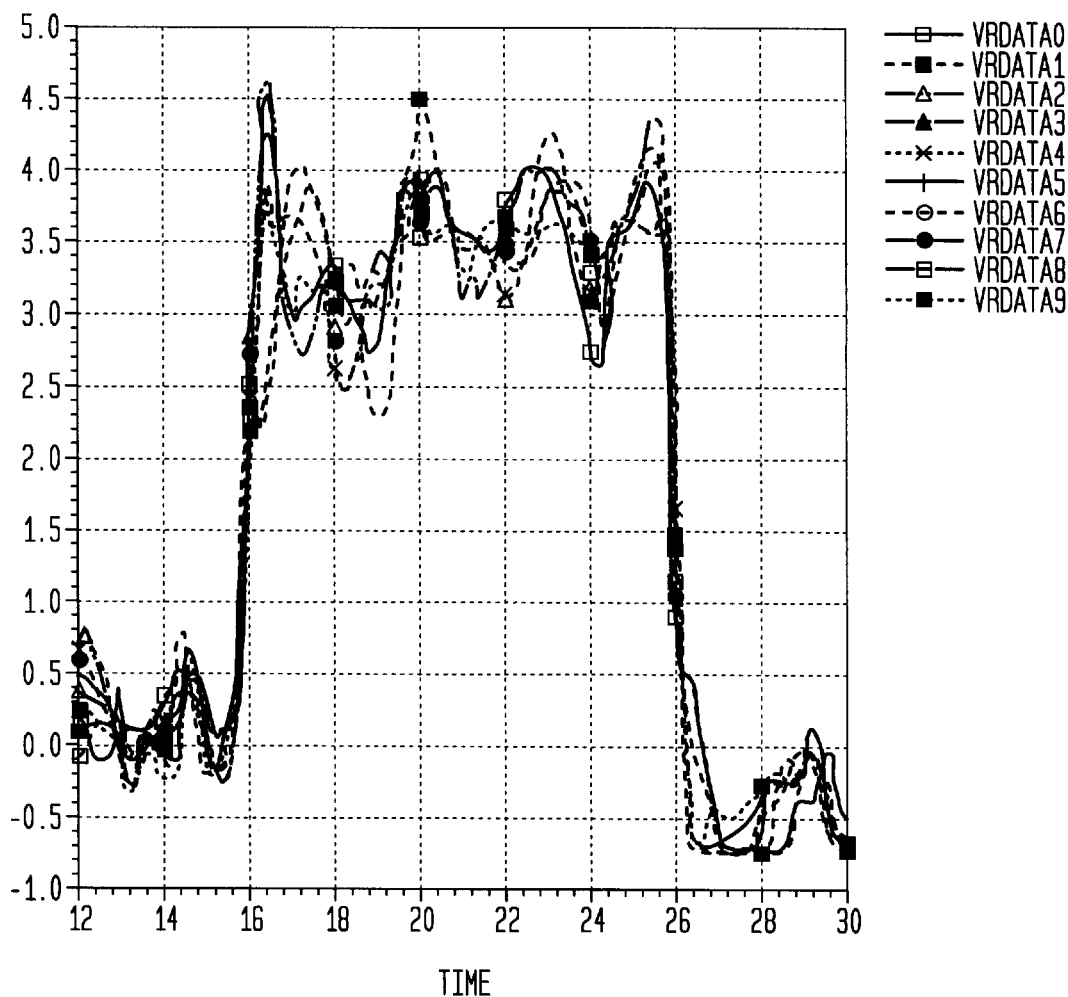
Figure 4B:
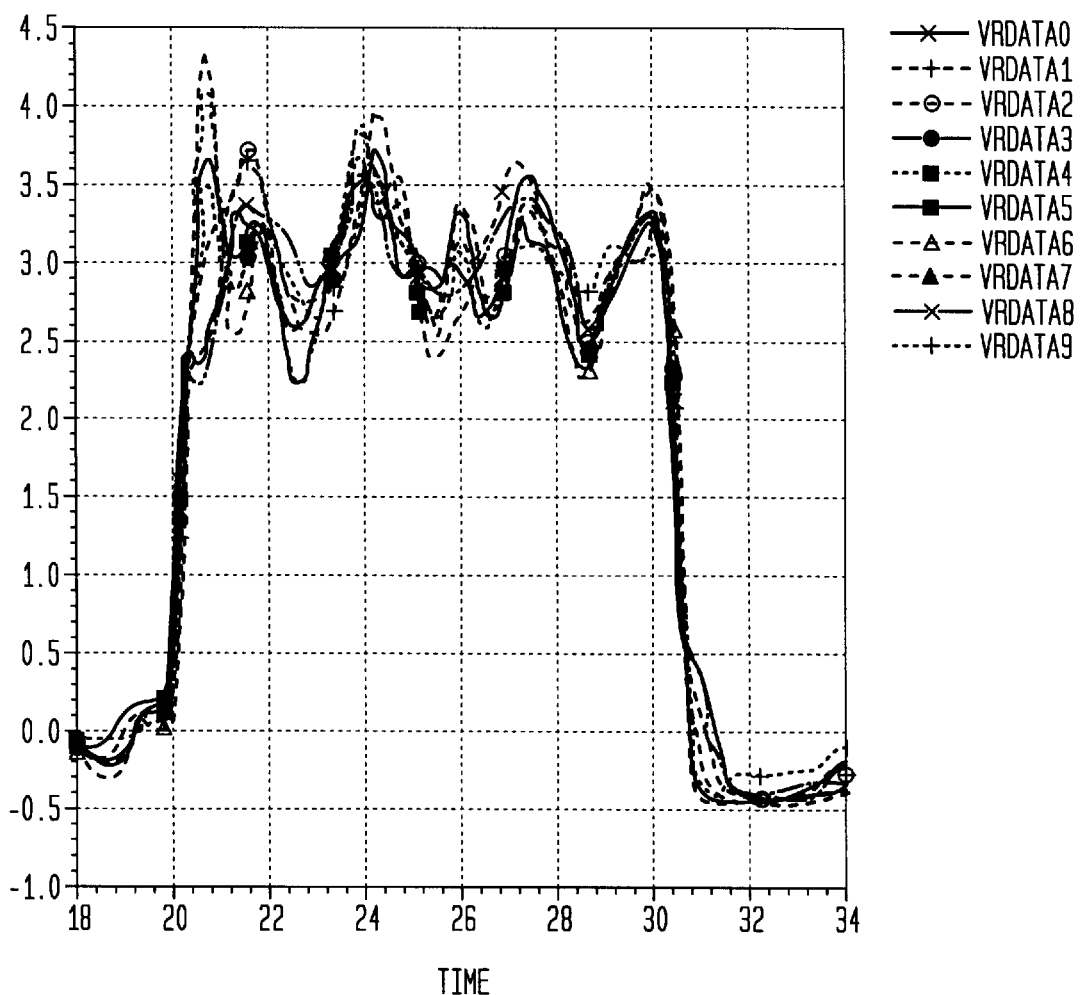
Figure 4D:
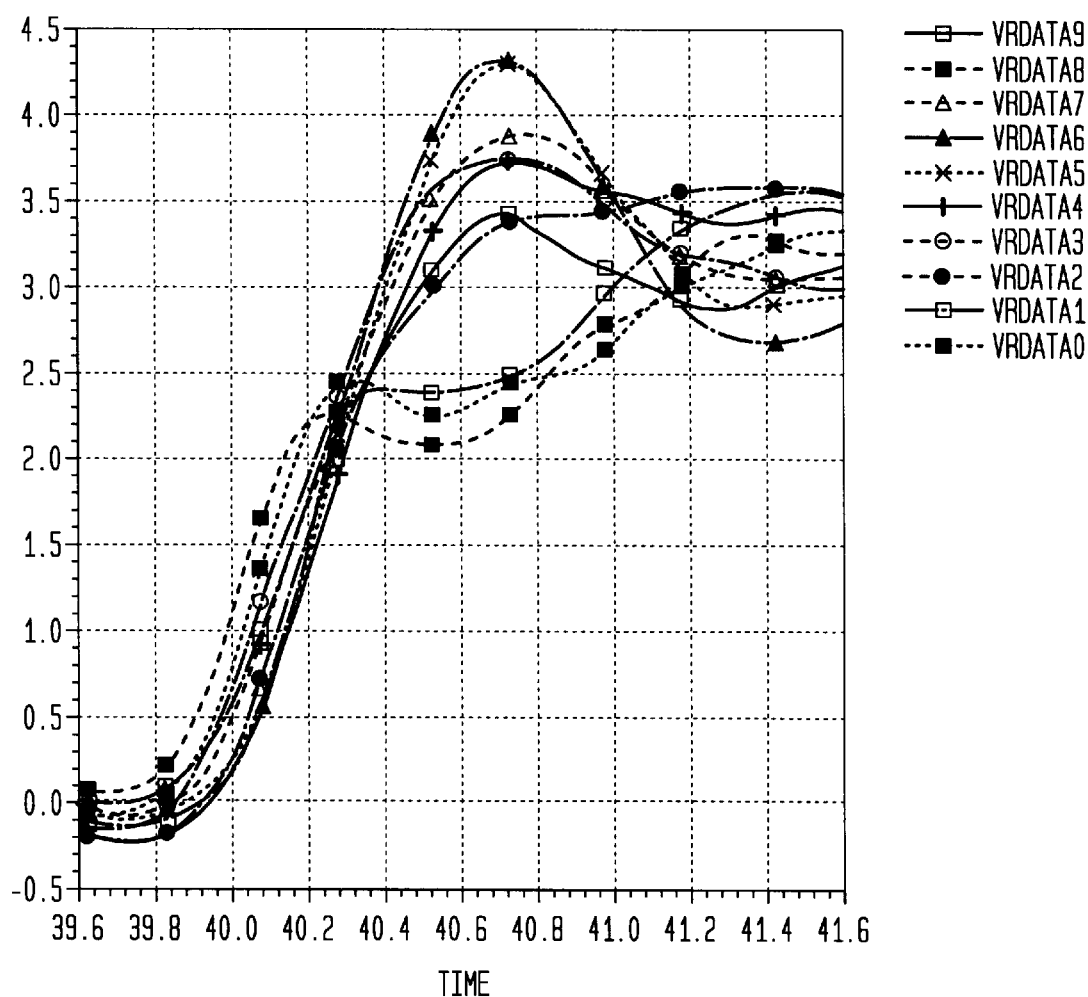

The arrangement in FIG. 5 has another application. By properly designing the output buffers of the HSHD 10 and 20, and properly choosing the values of $R_{s1}, \ldots, R_{sN}$, and $Rr_1, \ldots, Rr_N$, the unidirectional HSHD 10-to-HSHD 20 interface can become a bi-directional interface, namely, signals can not only flow from HSHD 10 to HSHD 20, but signals can also flow from HSHD 20 to HSHD 10. In this embodiment, resistors $Rr_1, \ldots, Rr_N$ can also act as a source termination, and resistors $R_{s1}, \ldots, R_{sN}$ can act in a manner similar to $Rr_1, \ldots Rr_N$ in FIG. 2. As an example, in a Utopia interface, which is an interface standard between an Asynchronous Transfer Mode (ATM) device and a Physical layer (PHY) device, the signals flow bidirectionally. If the ATM device and the PHY device have similar timing requirements, they can also have similar I/O buffers with similar driving ability. As a result, the same value resistors of Rsl~Rsn, and Rr1~Rrn may be used in each device. Further, the valves of Rs1~Rs and Rr1~Rrn may be substantially equal to the impedance of the PCB trace, or larger or smaller than the impedance of the PCB trace, depending on the application.

As described above, the present invention lowers the signal ringing caused by signal reflection in a PCB trace. The present invention also reduces glitches, oscillations, overshoots, and undershoots. As a result, the input signals are usable and the interface between HSHD devices operates correctly. Further, the setup procedure of the valid logic level of the input signal can be accomplished much more quickly and is much more stable.

An additional advantage of the present invention is that the inserted series resistor consumes very little extra power (except for a little thermal energy).

Although the present invention has been described in connection with the above embodiments, the present invention is not limited to these embodiments. In particular, although the present invention has been described above in conjunction with one or more series resistors, other implementations, such as or any other implementations known to one of ordinary skill in the art could also be utilized. For example, the resistor 60 may be placed in the package 50 of input device 20 in FIG. 5. Thus, the density of the PCB board can be increased because the resistor 60 is part of the input device 20. Further, the package bonding materials need not be gold or another expensive metal; the material may be another cheaper or high resistance metals.

Further, although the present invention has been described above in conjunction with FIG. 5 as showing a resistor for each input signal, resistors could be applied to only a subset of input signals as required. Further, as described above in connection with an input signal, the parameters for determining the value of any given series resistor may depend on the type of input signal to which it is connected, these additional parameters being known to one of ordinary skill in the art.

Further, although the present invention has been described above in conjunction with HSHD devices, other devices, such as any low speed MOS VLSI chip or any other devices known to one of ordinary skill in the art could also be utilized. Further, although the present invention has been described above in conjunction with PCB traces, other connections, such as metal wire, cables, connectors, bridges, and vias (a hole path between the front side and back side of two-sided PCB board) or any other connections known to one of ordinary skill in the art could also be utilized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus comprising:
a first device and
a second device,
said first and second devices each being a packaged microchip;
at least one connection between at least one input of said second device and at least one output of said first device: and
a termination structure comprising at least one external resistor, between said connection and said at least one input of said second device, said termination structure being in series with said connection and with said at least one input of said second device.

2. The apparatus of claim 1, said first and second device each being one of a high pin density package device or a MOS VLSI chip.

3. The apparatus of claim 1, said connection being one of a PCB trace, wire, cable, connector, bridge, or via.

4. The apparatus of claim 1, wherein said at least one resistor acts as an end termination for a unidirectional interface from said first device to said second device.

5. The apparatus of claim 1, further comprising at least one termination arrangement between said first device and said connection.

6. The apparatus of claim 5, wherein said at least one resistor acts as a source termination for a unidirectional interface from said second device to said first device.

7. The apparatus of claim 5, wherein a bi-directional interface is established between said first device and said second device.

8. The apparatus of claim 1, wherein said at least one resistor is part of the package of said second device.

9. The apparatus of claim 1, wherein a value of the at least one resistor depends on the signal propagated by said at least one connection.

10. The apparatus of claim 5, said first and second devices each being one of an asynchronous transfer mode (ATM) device or a physical layer (PHY) device.

11. The apparatus of claim 9, wherein a value of the at least one resistor depends on the overshoot and/or undershoot requirement of the second device.

12. The apparatus of claim 9, wherein the value of the at least one resistor depends on the rise time and/or fall time requirement of the signal.

13. The apparatus of claim 9, wherein the value of the at least one resistor is determined using transistor-level simulation.

14. The apparatus of claim 1, wherein the at least one resistor includes at least one discrete component.

15. A method for providing an interface between a first and second packaged microchip, comprising:
connecting an input of sad second microchip and an output pin of said first microchip with a signal transmission medium;
inserting a termination structure comprising an external resistor between said signal transmission medium and said input of said second microchip such that said termination structure is in series with said signal transmission medium and with said input of said second microchip.

16. The method of claim 15, said first and second packaged microchips each being one of a high pin density chip or a MOS VLSI chip.

17. The method of claim 15, said connection being one of a PCB trace, wire, cable, connector, bridge, or via.

18. The method of claim 15, wherein said at least one resistor acts as an end termination for a unidirectional interface from said first packaged microchip to said second packaged microchip.

19. The method of claim 15, further comprising:
inserting at least one termination arrangement between said first packaged microchip and said signal transmission medium.

20. The method of claim 19, wherein said at least one resistor acts as a source termination for a unidirectional interface from said second packaged microchip to said first packaged microchip.

21. The method of claim 19, wherein a bi-directional interface is established between said first packaged microchip and said second packaged microchip.

22. The method of claim 15, wherein a value of the at least one resistor depends on the overshoot and/or undershoot requirement of the second packaged microchip.

23. The method of claim 15, wherein a value of the at least one resistor depends on the rise time and/or fall time requirement of the signal propagated by said signal transmission medium.

24. The apparatus of claim 15, wherein the value of the at least one resistor is determined using transistor-level simulation.

25. The apparatus of claim 15, wherein the at least one resistor includes at least one discrete component.

\* \* \* \* \*